US011678037B2

United States Patent
Choi et al.

(10) Patent No.: US 11,678,037 B2
(45) Date of Patent: Jun. 13, 2023

(54) ELECTRONIC DEVICE INCLUDING ELECTRONIC COMPONENT ASSEMBLY

(71) Applicant: Samsung Electronics Co., Ltd., Gyeonggi-do (KR)

(72) Inventors: Jisoo Choi, Gyeonggi-do (KR); Jehyun Son, Gyeonggi-do (KR); Dusun Choi, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/721,412

(22) Filed: Apr. 15, 2022

(65) Prior Publication Data

US 2022/0247893 A1    Aug. 4, 2022

Related U.S. Application Data

(63) Continuation of application No. 16/884,446, filed on May 27, 2020, now Pat. No. 11,310,400.

(30) Foreign Application Priority Data

Jul. 26, 2019    (KR) .................. 10-2019-0090800

(51) Int. Cl.
*H04N 23/51*    (2023.01)
*H05K 1/02*    (2006.01)
(Continued)

(52) U.S. Cl.
CPC ........... *H04N 23/51* (2023.01); *G06F 1/1686* (2013.01); *H04N 23/57* (2023.01); *H05K 1/028* (2013.01);
(Continued)

(58) Field of Classification Search
CPC .. H04N 5/2252; H04N 5/2257; H04N 5/2258; H04N 23/51; H04N 23/57;
(Continued)

(56) References Cited

U.S. PATENT DOCUMENTS 10,270,952 B2    4/2019    Liu et al.
11,310,400 B2 *  4/2022    Choi .................... H04N 5/2252
(Continued)

FOREIGN PATENT DOCUMENTS

KR            10-0649770 B1   11/2006
KR       10-2008-0000275 A    1/2008
(Continued)

OTHER PUBLICATIONS

Machine English Translation of KR 20150113675 A, Oct. 8, 2015 (Year: 2015).*
European Search Report dated Aug. 19, 2022.

*Primary Examiner* — Nelson D. Hernández Hernández
(74) *Attorney, Agent, or Firm* — Cha & Reiter, LLC

(57) ABSTRACT

In embodiments, an electronic device comprises a housing including a printed circuit board (PCB) in an inner space thereof; and a camera module assembly disposed in the inner space and including: a module housing; a first camera module having a first camera housing, the first camera module disposed in at least a part of the module housing and including a first flexible PCB (FPCB) drawn out of the module housing and connected to the PCB; and a second camera module having a second camera housing separate from the first camera housing, the second camera module disposed in the module housing to be adjacent to the first camera module and including a second FPCB drawn out of the module housing and electrically connected to the PCB, wherein the first and second FPCBs are overlapped at least in part with each other, when the module housing is viewed from above, and drawn to face a same direction.

20 Claims, 9 Drawing Sheets

(51) Int. Cl.
*H04N 23/57* (2023.01)
*G06F 1/16* (2006.01)
*H05K 1/18* (2006.01)

(52) U.S. Cl.
CPC ... *H05K 1/189* (2013.01); *H05K 2201/10356* (2013.01)

(58) Field of Classification Search
CPC ............... H04N 23/45; H05K 1/028; H05K 2201/10356; H05K 2201/10151; H05K 2201/10121; H05K 2201/10189; G06F 1/1686; G06F 1/189
See application file for complete search history.

(56) References Cited

U.S. PATENT DOCUMENTS

| | | | |
|---|---|---|---|
| 2014/0151118 A1 | 6/2014 | Han et al. | |
| 2017/0172005 A1 | 6/2017 | Kim et al. | |
| 2018/0167540 A1* | 6/2018 | Liu | H04N 5/247 |
| 2018/0176435 A1* | 6/2018 | Wei | H05K 1/028 |
| 2018/0198966 A1 | 7/2018 | Tang et al. | |
| 2019/0082083 A1 | 3/2019 | Jarvis et al. | |
| 2020/0310489 A1* | 10/2020 | Spraggs | H04N 5/2258 |

FOREIGN PATENT DOCUMENTS

| | | | | |
|---|---|---|---|---|
| KR | 10-2015-0113675 A | | 10/2015 | |
| KR | 20150113675 A | * | 10/2015 | ............. G03B 19/22 |
| KR | 10-2017-0018625 A | | 2/2017 | |

\* cited by examiner

ELECTRONIC DEVICE INCLUDING ELECTRONIC COMPONENT ASSEMBLY

CROSS-REFERENCE TO RELATED APPLICATION(S)

This application is a Continuation of Ser. No. 16/884,446 filed on May 27, 2020 which is based on and claims priority under 35 U.S.C. 119 to Korean Patent Application No. 10-2019-0090800, filed on Jul. 26, 2019, in the Korean Intellectual Property Office, the disclosures of which are herein incorporated by reference in their entireties.

BACKGROUND

1. Field

Certain embodiments of the disclosure relate to an electronic device including an electronic component assembly.

2. Description of Related Art

Electronic devices house numerous components that are mounted onto a substrate. Multiple neighboring electronic components with similar functions are disposed as a single assembly and electrical connected to a shared substrate. A problem occurs when one of the multiple neighboring components needs to be replaced. Although only one of the multiple neighboring components needs to be replaced, it may be only possible to replace the entire assembly.

SUMMARY

Certain embodiments of the disclosure may provide an electronic device including an electronic component assembly.

According to certain embodiments of the disclosure, an electronic device comprises a housing including a printed circuit board (PCB) in an inner space thereof; and a camera module assembly disposed in the inner space and including: a module housing; a first camera module having a first camera housing, the first camera module removably disposed in at least a part of the module housing and including a first flexible PCB (FPCB) drawn out of the module housing and connected to the PCB; and a second camera module having a second camera housing separate from the first camera housing, the second camera module removably disposed in the module housing to be adjacent to the first camera module and including a second FPCB drawn out of the module housing and electrically connected to the PCB, wherein the first and second FPCBs are overlapped at least in part with each other, when the module housing is viewed from above, and drawn to face a same direction.

According to certain embodiments of the disclosure, an electronic device comprises a housing including a printed circuit board (PCB) in an inner space thereof; and an electronic component assembly disposed in the inner space and including: a module housing; a first electronic component having a first housing, the first electrical component removably disposed in at least a part of the module housing and including a first flexible PCB (FPCB) drawn out of the module housing and connected to the PCB; and a second electronic component having a second housing separate from the first housing, the second electronic component removably disposed in the module housing to be adjacent to the first electronic component and including a second FPCB drawn out of the module housing and connected to the PCB, wherein the first and second FPCBs are overlapped at least in part with each other, when the module housing is viewed from above, and drawn to face a same direction.

BRIEF DESCRIPTION OF THE DRAWINGS

The above and other aspects, features and advantages of certain embodiments of the disclosure will be more apparent from the following detailed description, taken in conjunction with the accompanying drawings.

DETAILED DESCRIPTION

An electronic device may include a numerous electronic components mounted in an inner space. The respective electronic components may be disposed to perform their functions at their respective positions in the inner space and generally connected to a printed circuit board (PCB) (e.g., a main board or substrate) through an electrical connection member (e.g., flexible PCB (FPCB)). The plurality of electronic components may include a plurality of sensor modules for detecting an external environment of the electronic device. These sensor modules may include a proximity sensor module, an illumination sensor module, a camera module, an ultrasonic sensor module, an iris sensor module, a biometric sensor module such as a heart rate sensor module, and/or an optical system sensor module such as a time-of-flight (TOF) sensor module.

Among the plurality of electronic components, at least two electronic components may be disposed as a single assembly in consideration of positions of neighboring electronic components or function relevance. In this assembly, two or more electronic components may be electrically connected to one shared substrate.

The foregoing configuration can be problematic when maintenance of any one of two or more electronic components is required. The entire assembly may have to be replaced, including the components that do not need maintenance, because each electronic component is not independently disposed. This may cause unnecessary maintenance costs. In addition, when individual electronic components are arranged in one assembly, a cumbersome redesign for connecting the FPCBs, drawn from different electronic components in different directions, to the PCB may be required.

Accordingly, certain embodiments may alleviate the foregoing problems.

Figure 1:
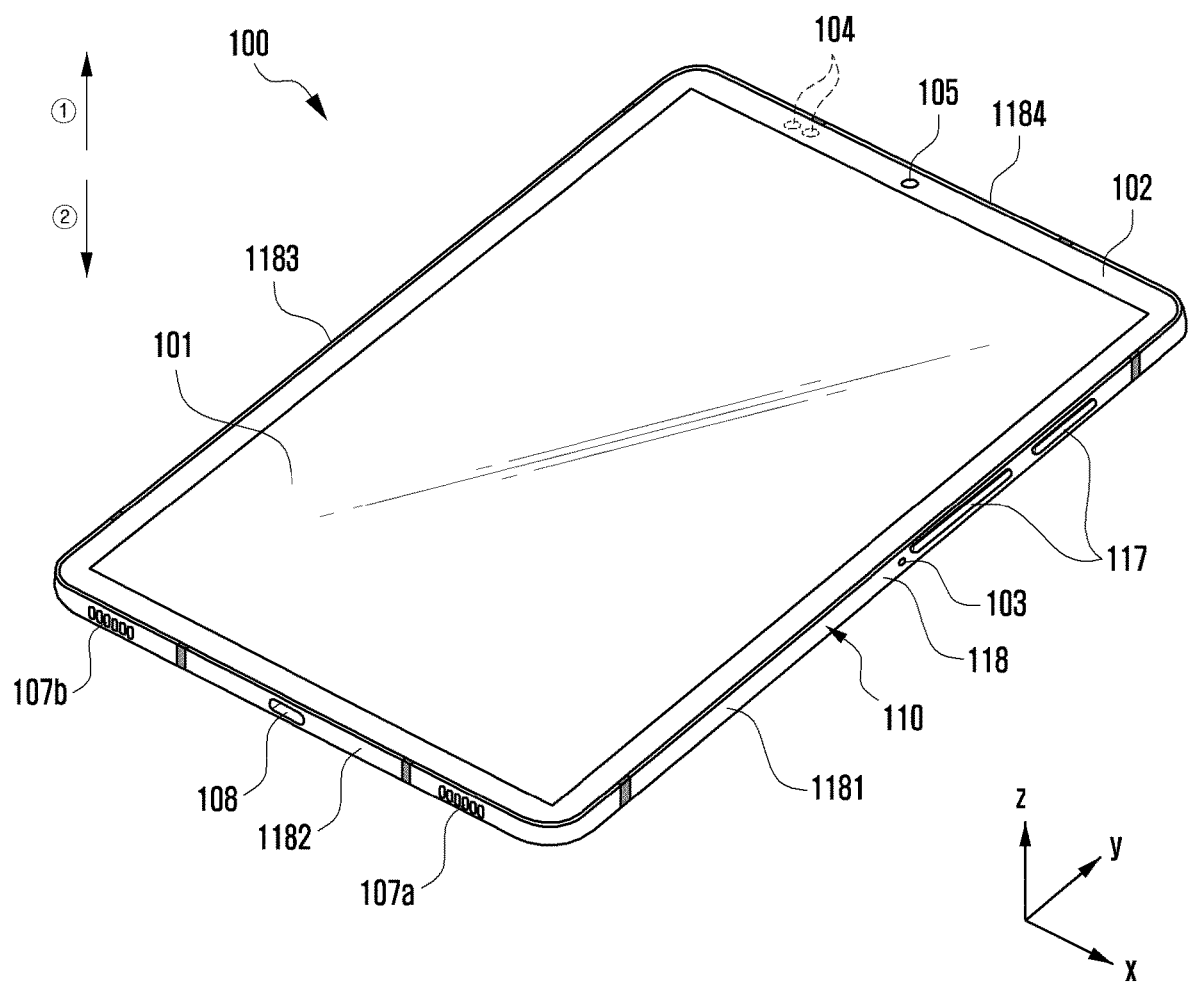
FIG. 1 is a perspective view showing a front surface of an electronic device according to certain embodiments of the disclosure.
Figure 2:
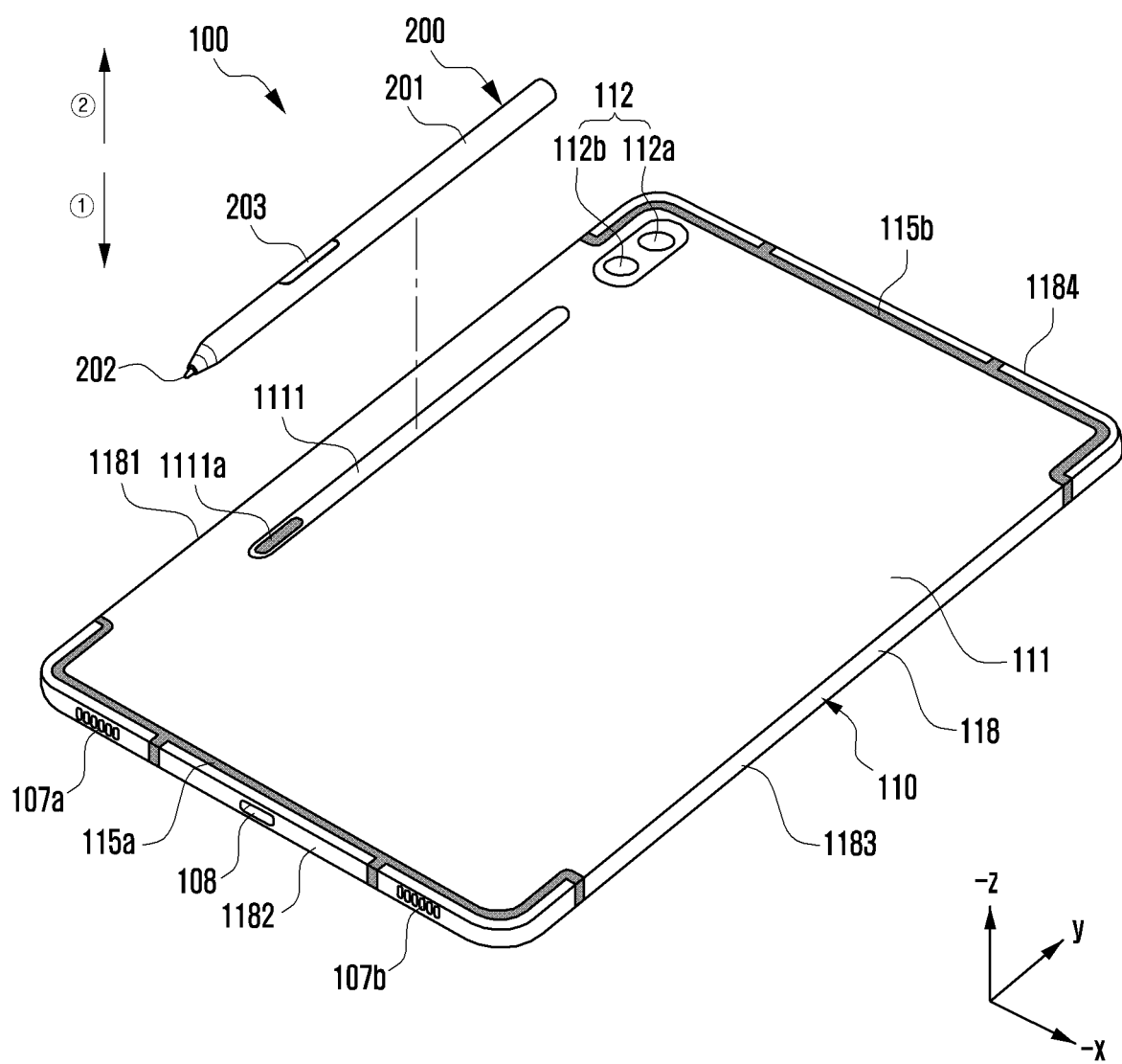
FIG. 2 is a perspective view showing a rear surface of the electronic device shown in FIG. 1.
Figure 3:
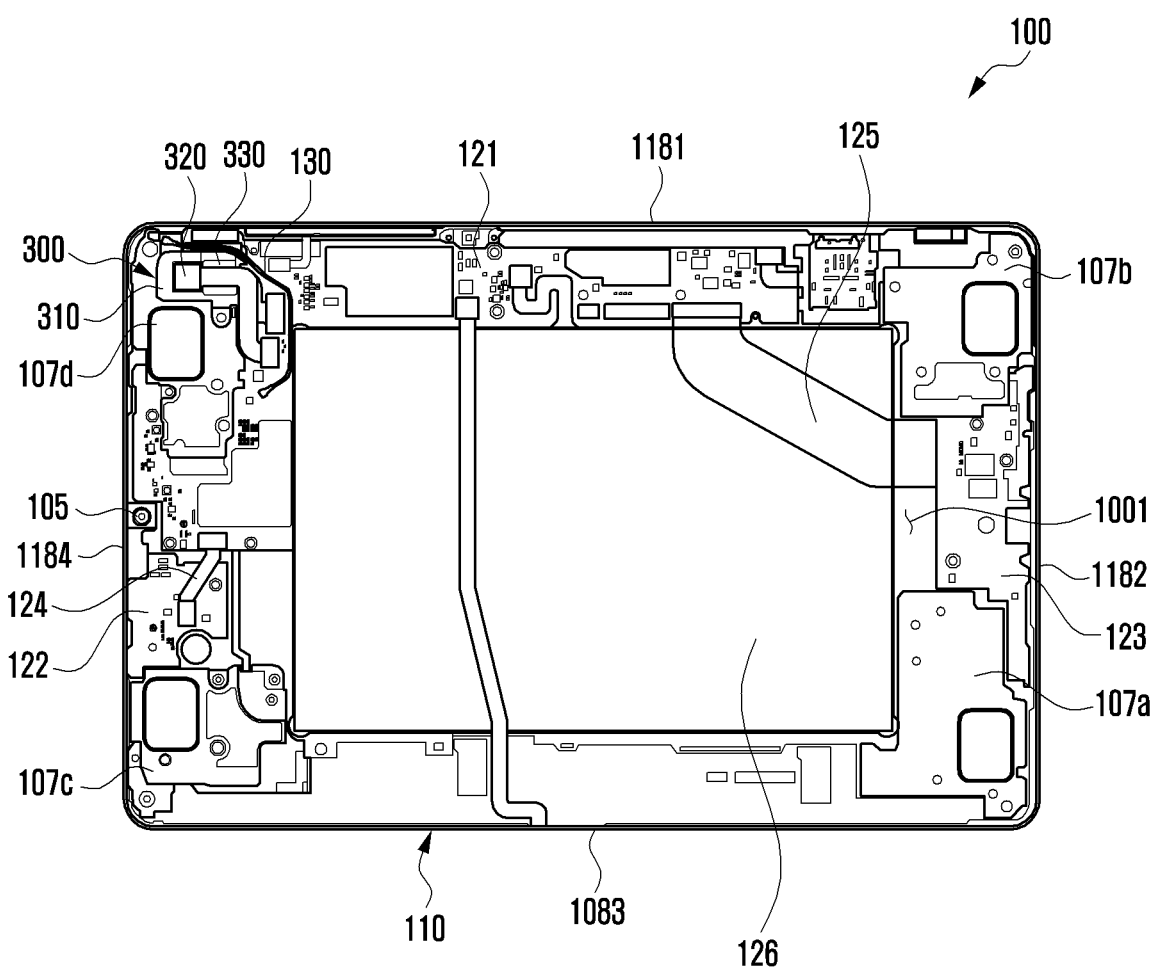
FIG. 3 is a plan view showing an internal configuration of an electronic device according to certain embodiments of the disclosure.

FIGS. 1 and 2 disclose an electronic device which internally may have multiple components mounted onto a PCB. FIG. 3 shows multiple components connected to a PCB in the inner space of the electronic device. FIG. 4-7B show camera modules that can be separately removed and replaced from the electronic device.

Hereinafter, embodiments of the disclosure will be described in detail with reference to accompanying drawings.

FIG. 1 illustrates an electronic device. The electronic device can include an inner space. Respective electronic components performing functions in the inner space. At least two of the respective electronic components may be disposed as a single assembly. However, while that at least two components may be in single assembly may be individually removed.

FIG. 1 is a perspective view showing a front surface of an electronic device 100 according to certain embodiments of the disclosure. FIG. 2 is a perspective view showing a rear surface of the electronic device 100 shown in FIG. 1.

Referring to FIGS. 1 and 2, the electronic device 100 may be substantially rectangular and planar. The electronic device 100 may include a housing 110 (e.g., a housing structure) that includes a front cover 102 facing a first direction (i.e., a positive direction of the Z-axis), a rear cover 111 facing a direction (i.e., a negative direction of the Z-axis) opposite to the first direction, and a lateral member 118 surrounding an inner space (e.g., an inner space 1001 in FIG. 3) between the front cover 102 and the rear cover 111. According to an embodiment, the lateral member 118 may include a first lateral surface 1181 having a first length, a second lateral surface 1182 extended substantially perpendicularly from the first lateral surface and having a second length shorter than the first length, a third lateral surface 1183 extended from the second lateral surface substantially parallel with the first lateral surface and having the first length, and a fourth lateral surface 1184 extended from the third lateral surface in parallel with the second lateral surface and having the second length.

The front cover 102 may be formed of a glass plate or polymer plate having various coating layers. The rear cover 111 may be formed of coated or colored glass, ceramic, polymer, metal (e.g., aluminum, stainless steel (STS), or magnesium), or a combination thereof. The lateral member 118 may be formed of a lateral bezel structure combined with the front and rear covers 102 and 111 and having a metal and/or polymer. As one alternative, the rear cover 111 and the lateral member 118 may be integrally formed and have the same material (e.g., metal such as aluminum or magnesium).

The electronic device 100 may include a display 101, at least one input device 103, sound output devices 107a and 107b, a sensor module 104, camera modules 105, 112a, and 112b, at least one key input device 117, and/or a connector hole 108. In some embodiments, the electronic device 100 may omit at least one of the above-listed components (e.g., the key input device 117) or further include any other component.

The display 101 may be exposed through a considerable portion of the front cover 102. In another embodiment, the display 101 may be exposed through the substantially entire area of front cover 102. In still another embodiment, edges and corners of the display 101 may be formed to substantially resemble adjacent outlines of the front cover 102. In yet another embodiment, in order to expand an exposed area of the display 101, a gap between edges of the display 101 and corresponding edges of the front cover 102 may be unvaried substantially. In further another embodiment, the display 101 may have a recess or opening in a portion of a screen display area (i.e., an active area) thereof such that at least one of the above-listed components is disposed within the recess or opening in the inner space of the electronic device 100. In further another embodiment, at least one of the sensor module 104, the camera module 105, an audio module (not shown), a fingerprint sensor (not shown), or a light emitting device (not shown) may be disposed under the display 101 within the screen display area in the inner space of the electronic device 100. In further another embodiment, the display 101 may be disposed to be combined with or adjacent to a touch detection circuit, a pressure sensor for measuring the intensity (or pressure) of a touch, and/or an electromagnetic induction panel (e.g., a digitizer) for detecting an electronic pen (e.g., a stylus pen) of magnetic field type.

The input device 103 may include at least one microphone module. In some embodiments, the input device 103 may include a plurality of microphone modules disposed at different positions to sense the direction of sound. The sound output devices 107a and 107b may include a speaker module. The speaker modules 107a and 107b may include an external speaker and/or a call receiver.

The at least one sensor module 104 may generate an electrical signal or data value corresponding to an internal operating state or external environmental state of the electronic device 100. The at least one sensor module 104 may include at least one of a proximity sensor, a fingerprint sensor, a heart rate monitor (HRM) sensor, a gesture sensor, a gyro sensor, a barometric sensor, a magnetic sensor, an acceleration sensor, a grip sensor, a color sensor, an infrared (IR) sensor, a biometric sensor, a temperature sensor, a humidity sensor, or an illuminance sensor.

The at least one key input device 117 may be disposed through the lateral member 118 of the housing 110. In a certain embodiment, some or all of the at least one key input device 117 may be implemented in the form of a soft key displayed on the display 101. In another embodiment, the key input device 117 may be implemented using a pressure sensor included in the display 101. In still another embodiment, the key input device 117 may include at least one pressure-sensitive key using a strain gauge disposed in the electronic device 100 and measuring a pressure change due to a pressure of the lateral member 118. According to an embodiment, the connector hole 108 may accommodate a connector (e.g., a USB connector or an IF connector) for transmitting and receiving power, data, and/or sound signals to and from an external electronic device.

The camera modules 105, 112a, and 112b may include a front camera module 105 disposed to be exposed to the outside through the front cover 102 of the electronic device 100, and rear camera modules 112a and 112b disposed to be exposed to the outside through the rear cover 111. According to an embodiment, the camera modules 105, 112a, and 112b may include one or a plurality of lenses, an image sensor, and/or an image signal processor. According to an embodiment, the rear camera modules 112a and 112b may be adjacent to each other and thus disposed as one camera module assembly 112. For example, a pair of the camera modules 112a and 112b in the camera module assembly 112 may perform a dual camera function for general shooting, wide-angle shooting, or ultra-wide-angle shooting. As will described later, although the camera module assembly may be a single assembly, camera modules 112a and 112b may be individually removed and replaced.

According to certain embodiments, the electronic device 100 may include an electronic pen 200 that is detachably disposed in a pen holder 1111 formed in a portion of the rear cover 111. According to an embodiment, the electronic pen 200 may include an elongated hollow pen housing 201 and a pen tip 202 disposed at one end of the pen housing 201. According to an embodiment, the electronic pen 200 may include a key button 203 disposed in a portion of the pen housing 201. According to an embodiment, the electronic pen 200 may be attached to the pen holder 1111 through a magnetic force of at least one magnet. According to an embodiment, the electronic pen 200 may include a battery (not shown) disposed in the pen housing 201 and used for short-range wireless communication (e.g., Bluetooth communication). According to an embodiment, the electronic pen 200 may include a coil member (not shown) for electromagnetic induction and/or wireless charging, and may charge the battery through the coil member and a wireless charging spot 1111a disposed in the pen holder 1111. According to an embodiment, the electronic pen 200 may be based on an electro-magnetic resonance (EMR) technology, an active electrical stylus (AES) technology, or an electric coupled resonance (ECR) technology.

According to certain embodiments, the electronic device 100 may be divided into conductive portions through non-conductive members 115a and 115b (e.g., polymer) disposed in at least a portion of the rear cover 111 and/or the lateral member 118. Each conductive portion may be used as an antenna radiator that operates in a particular frequency band.

According to an embodiment, the two camera modules 112a and 112b may be disposed as one camera module assembly 112 on the rear cover 111. Additionally or alternatively, various electronic components other than the camera modules may be disposed as one assembly. However, a single of the camera modules 112a or 112b can be individually removed and replaced, without requiring removal and replacement of the other camera module 112b.

In one embodiment there is a single camera assembly. The camera assembly includes a module housing (FIG. 3, 310). The module housing can house multiple camera modules (FIG. 3, 320, 330) therein, associated with FPCBs for connection with a PCB. Although the single camera assembly contains both camera modules, each camera module can be separately removed and replaced without requiring replacement of the other(s).

Although an embodiment is shown with a single camera assembly, it is noted that the disclosure is not limited to camera modules and different embodiments may use different modules.

FIG. 3 is a plan view showing an internal configuration of an electronic device 100 according to certain embodiments of the disclosure. FIG. 3 shows the inner space 1001 of the electronic device 100 from which the display 101 and the front cover 102, shown in FIG. 2, are removed. Referring to FIG. 3, the electronic device 100 may include a battery 126 disposed in the inner space 1001. According to an embodiment, the electronic device 100 may include a printed circuit board (PCB) 121 (e.g., a main board or substrate) disposed to surround at least a portion of the battery 126. In another embodiment, the PCB 121 may be disposed to be overlapped at least in part with the battery 126. The electronic device 100 may include a first sub-substrate 122 and a second sub-substrate 123 each of which is disposed around the battery 126 at a distance from the PCB 121. The first sub-substrate 122 and the second sub-substrate 123 may be electrically connected to the PCB 121 through flexible PCBs (FPCBs) 124 and 125. According to an embodiment, the electronic device 100 may include one or more speaker modules 107a, 107b, 107c, and 107d disposed at regular intervals around the battery 126 in the inner space 1001. For example, four speaker modules 107a, 107b, 107c, and 107d may be disposed respectively at four corners of the inner space 1001 of the electronic device 100.

Generally, electronic components are mounted onto a PCB 121. Different functionalities can be combined into a single assembly that is mounted onto the PCB 121. However, different modules in the single assembly can be individually replaced without replacing the remaining modules. Therefore, the single assembly is mounted as a single component onto the PCB, modules within the single assembly can be individually removed and replaced while leaving the remaining modules. For example, a camera module assembly will be described.

The electronic device 100 may include a camera module assembly 300 (e.g., the camera module assembly 112 in FIG. 2) disposed in the inner space 1001. The camera module assembly 300 may be disposed at a corner between the first lateral surface 1181 and the fourth lateral surface 1184. In another embodiment, the camera module assembly 300 may be disposed at various positions in the inner space 1001 of the electronic device 100.

The camera module assembly 300 may include a module housing 310 and also include a first camera module 320 (e.g., the first camera module 112a in FIG. 2) and a second camera module 330 (e.g., the second camera module 112b in FIG. 2). The first camera module 320 and the second camera module 330 are each removably disposed side by side to be adjacent within the module housing 310. Moreover, the first camera module 320 and the second module 330 are not directly connected to each other. Thus one of the first camera modules 320 and camera module 330 can be removed without removing and replaced without removing and replacing the other camera module.

In another embodiment, the camera module assembly 300 includes a module housing 310, a first camera module 320 and a second camera module 330. The first camera module 320 and the second camera module 330 can each be removably disposed in the module housing 310. The foregoing allows removal and replacement of either the first camera module 320 or the second camera module 330 without removal and replacement of the other.

In another embodiment, the camera module assembly 300 may include three or more camera modules arranged side by side to be adjacent to the module housing 310. According to an embodiment, the module housing 310 may have a support structure for supporting electronic components 130 other than the camera modules 320 and 330. For example, the module housing 310 may have a support structure for supporting at least a portion of an RF cable 130 that electrically connects an antenna structure and a wireless communication circuit of the PCB 121 in the inner space 1001 of the electronic device 100.

Figure 4:
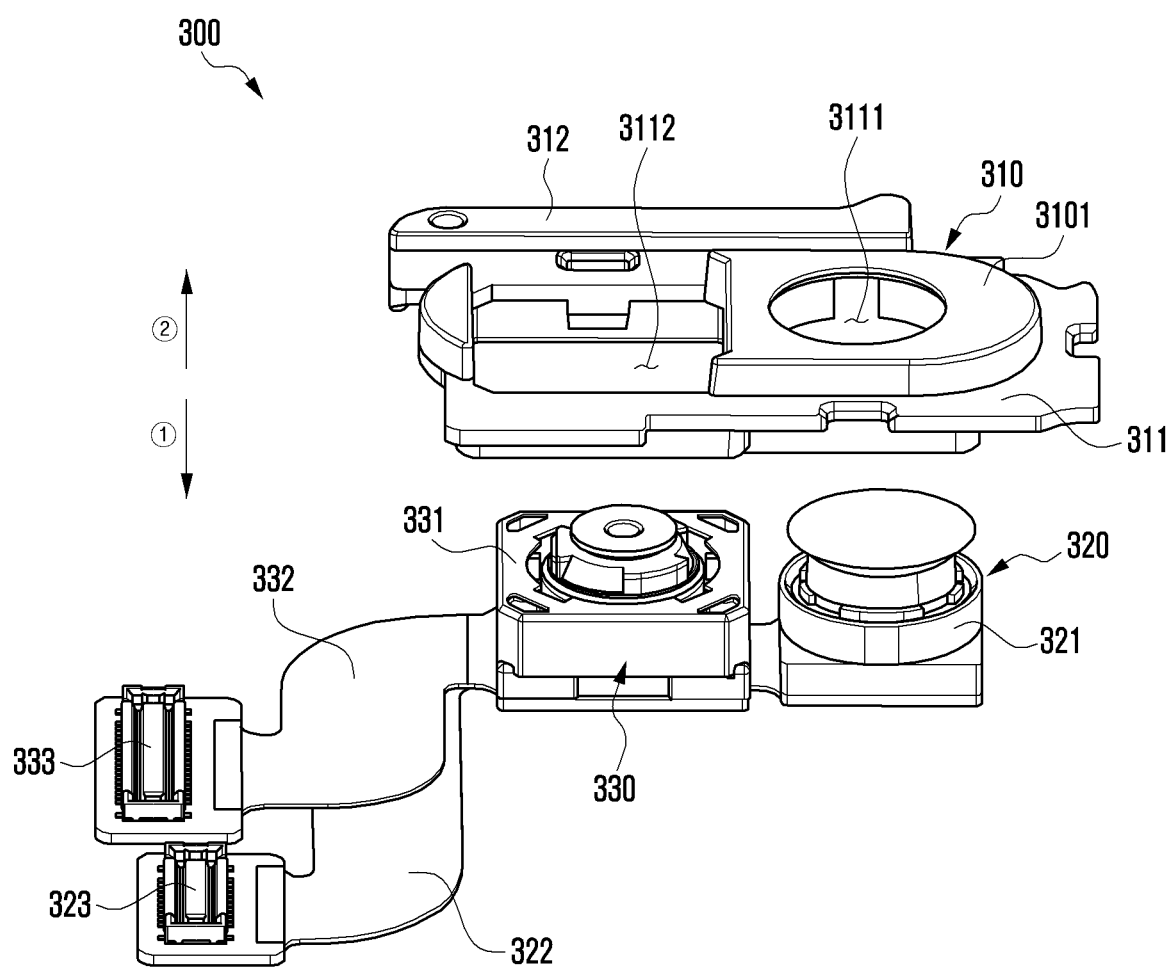
FIG. 4 is an exploded perspective view showing a camera module assembly according to certain embodiments of the disclosure.
Figure 5A:
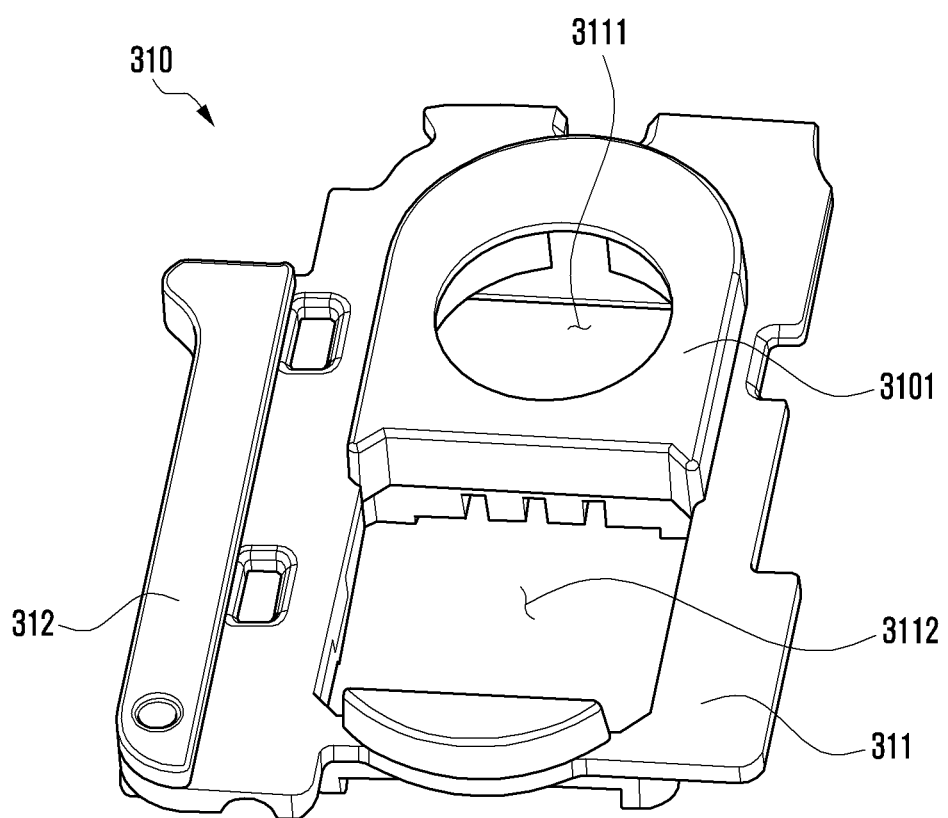
FIGS. 5A and 5B are perspective views showing front and rear surfaces of a module housing according to certain embodiments of the disclosure.
Figure 5B:
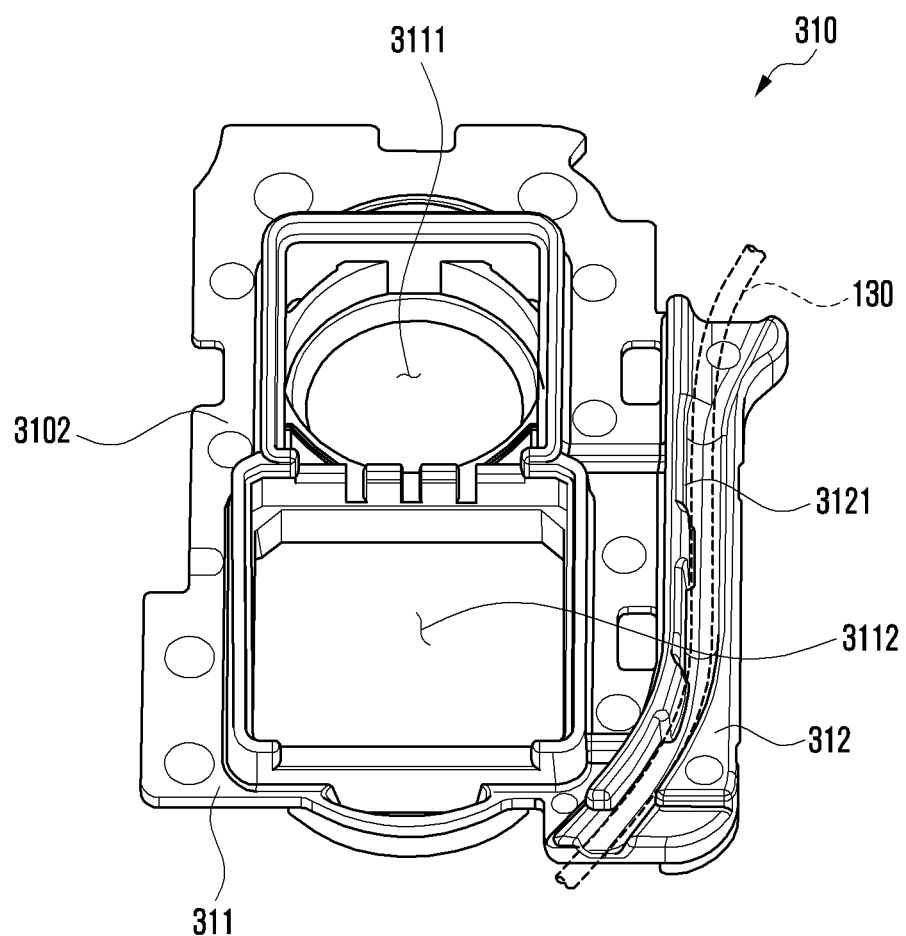
Figure 6:
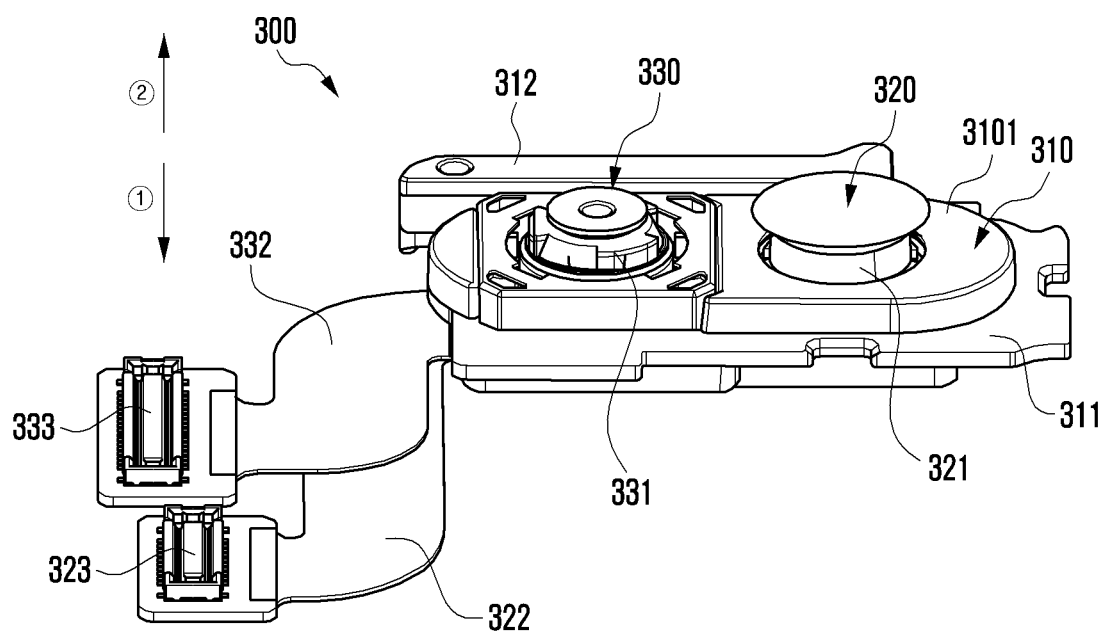
FIG. 6 is a perspective view showing an assembled state of the camera module assembly according to certain embodiments of the disclosure.

FIG. 4 is an exploded perspective view showing a camera module assembly 300 according to certain embodiments of the disclosure. FIGS. 5A and 5B are perspective views showing front and rear surfaces 3101 and 3102 of a module housing 310 according to certain embodiments of the disclosure. FIG. 6 is a perspective view showing an assembled state of the camera module assembly 300 according to certain embodiments of the disclosure.

Referring to FIGS. 4 to 6, the camera module assembly 300 may include the module housing 310 and a pair of camera modules 320 and 330 arranged side by side to be adjacent within the module housing 310. The first camera module 320 and the second camera module 330 may be different camera modules selected from among a camera module for general shooting, a camera module for wide-angle shooting, a camera module for ultra-wide-angle shooting, and a camera module for telephoto shooting. According to an embodiment, the first camera module 320 may include a first camera unit 321 disposed in the module housing 310, a first FPCB 322 drawn out of the module housing 310 from the first camera unit 321, and a first electrical connector 323 disposed at an end of the first FPCB 322 and electrically connected to a PCB (e.g., the PCB 121 in FIG. 3). Similarly, the second camera module 330 may include a second camera unit 331 disposed in the module housing 310, a second FPCB 332 drawn out of the module housing 310 from the second camera unit 331, and a second electrical connector 333 disposed at an end of the second FPCB 332 and electrically connected to the PCB (e.g., the PCB 121 in FIG. 3). According to an embodiment, one of the first FPCB 322 and the second FPCB 332 may pass through the rear of the camera unit from which the other is drawn, and then both may be arranged side by side or superposed. For example, as shown, the first FPCB 322 may pass through the rear of the second camera unit 331 and then be arranged side by side or overlapped at least in part with the second FPCB 332. According to an embodiment, each of the first camera unit 321 and the second camera unit 331 may each include a plurality of lenses, a lens housing supporting the plurality of lenses, and a camera housing accommodating the lens housing and having at least one image sensor. According to an embodiment, the lens housing may be movable from the camera housing through a driving member.

The camera housing of the first camera unit 321 can be separate from the camera housing of the second camera unit 331, and vice versa. The camera housing of the first camera unit 321 and the housing of the second camera unit 331 can be separate in that there is no portion of either housing that is common to both housings. The separate camera housings may be placed and held in contact with each other by an external device such as housing 310.

According to certain embodiments, the module housing 310 may include a body 311 for accommodating a pair of the camera modules 320 and 330, and an extension 312 extended from one side of the body 311 and having a support structure 3121 for supporting at least a portion of nearby other electronic component (e.g., the RF cable 130 in FIG. 3). The body 311 of the module housing 310 may have a first surface 3101 formed in a direction (② direction) faced by a rear cover (e.g., the rear cover 111 in FIG. 2), and a second surface 3102 opposite to the first surface 3101 and formed in a direction (① direction) faced by a front cover (e.g., the front cover 102 in FIG. 1). The body 311 may have a first opening 3111 (e.g., a first mounting portion) and a second opening 3112 (e.g., a second mounting portion), both of which are formed separately to penetrate from the first surface 3101 to the second surface 3102 and formed to be adjacent to each other. The first opening 3111 may be formed in a shape of accommodating and supporting at least a portion of the first camera module 320. Similarly, the second opening 3112 may be formed in a shape of accommodating and supporting at least a portion of the second camera module 330. The module housing 310 may be formed of metal and/or polymer.

According to certain embodiments, the module housing 310 may include the extension 312 extended from one side of the body 311 to accommodate at least a portion of nearby other electronic component. According to an embodiment, the extension 312 may include a support structure 3121 for accommodating or supporting at least a portion of a nearby electronic component (e.g., the RF cable 130). For example, when the nearby electronic component is the RF cable 130, the support structure 3121 may be formed in a shape of a groove for supporting at least a portion of the cable. In this case, the extension 312 of the module housing 310 may be formed of at least an insulating material (e.g., polymer).

Referring to FIG. 6, the first camera module 320 may be removably disposed such that the first camera unit 321 is exposed at least in part through the first opening 3111 of the module housing 310. For example, the first camera module 320 may be removably disposed such that the first camera unit 321 is at least partially exposed or protruded through the first opening 3111 in a direction (② direction) where the first surface 3101 of the module housing 310 faces. Similarly, the second camera module 330 may be removably disposed such that the second camera unit 331 is exposed at least in part through the second opening 3112 of the module housing 310. For example, the second camera module 330 may be removably disposed such that the second camera unit 331 is at least partially exposed or protruded through the second opening 3112 in a direction (② direction) where the first surface 3101 of the module housing 310 faces.

According to embodiments of the disclosure, although the camera module assembly 300 has an integrated structure in which two camera modules 320 and 330 are disposed in a single module housing 310, each of the camera modules 320 and 330 are disposed individually and independently. Therefore, even if any one of the camera modules 320 and 330 is damaged, the damaged camera module only can be replaced without requiring a change of the other camera module. This allows cost-effective maintenance. Moreover, the module housing has a supporting structure for a nearby electronic component. This offers a space-efficient component mounting structure in the inner space 1001 of the electronic device 100.

Figure 7A:
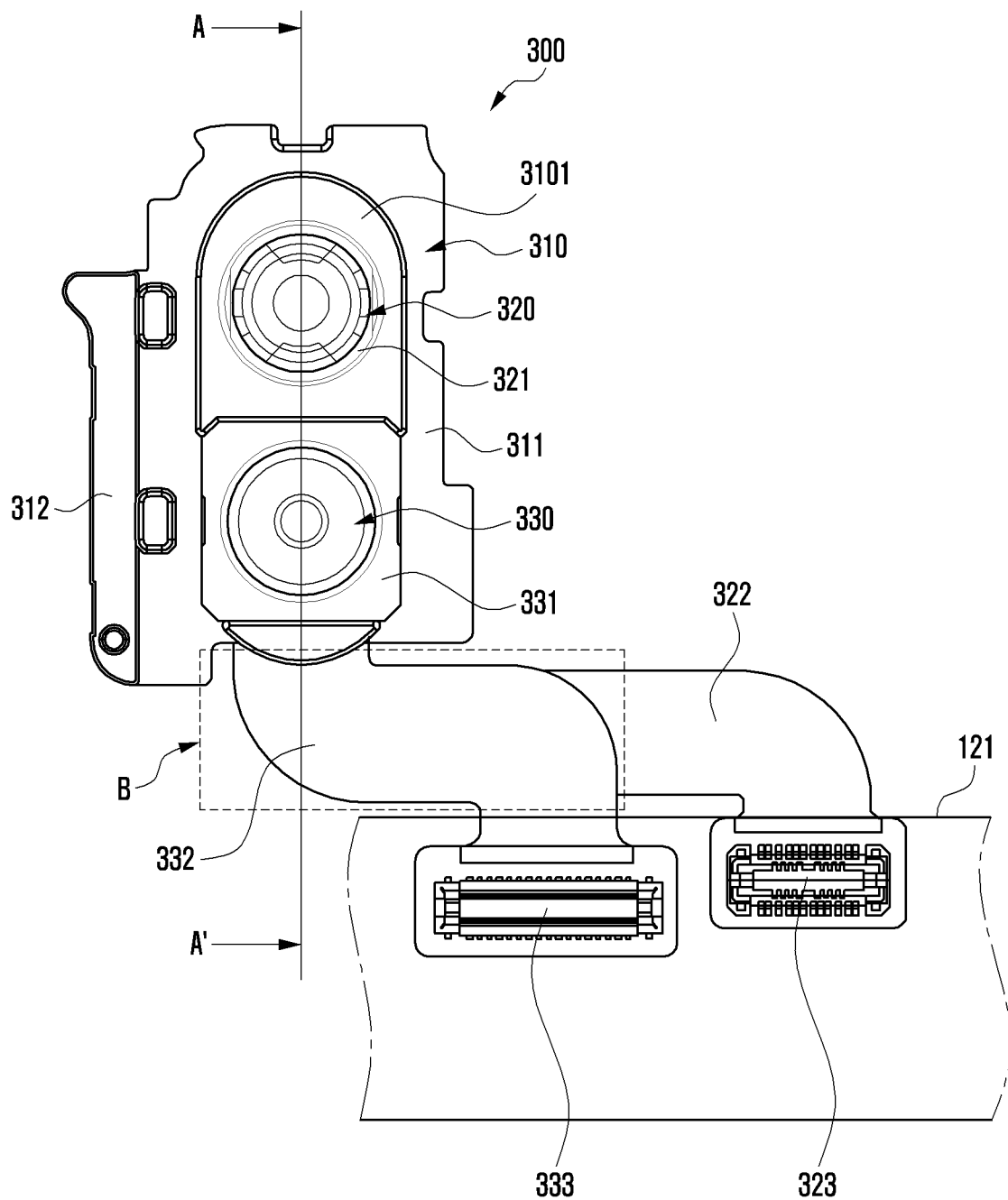
FIG. 7A is a schematic view showing a combined state of the camera module assembly and a printed circuit board according to certain embodiments of the disclosure.
Figure 7B:
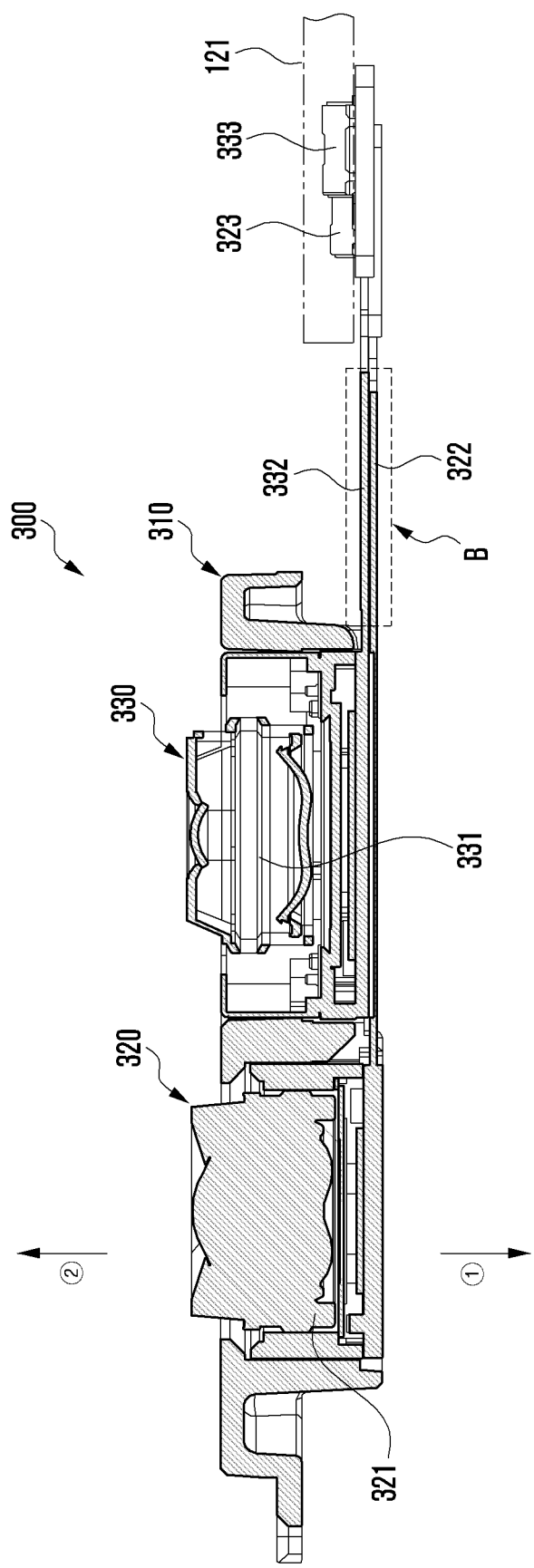
FIG. 7B is a cross-sectional view taken along the line A-A' of FIG. 7A.

FIG. 7A is a schematic view showing a combined state of the camera module assembly 300 and a printed circuit board 121 according to certain embodiments of the disclosure. FIG. 7B is a cross-sectional view taken along the line A-A' of FIG. 7A.

Referring to FIGS. 7A and 7B, the camera module assembly 300 may include the first camera module 320 and the second camera module 330 both of which are removably disposed in the module housing 310. The first and second camera modules 320 and 330 may be disposed such that the first camera unit 321 (e.g., a lens barrel member including a lens) and the second camera unit 331 (e.g., a lens barrel member including a lens) are at least partially exposed or protruded from the module housing 310 in a direction where a rear cover (e.g., the rear cover 111 in FIG. 2) of an electronic device (e.g., the electronic device 100 in FIGS. 1 to 3) faces. Portions of the first and second camera units 321 and 331, exposed from the module housing 310, may be disposed to detect an external environment through the rear cover of the electronic device when the camera module assembly 300 is disposed in an inner space (e.g., the inner space 1001 in FIG. 3) of the electronic device.

According to certain embodiments, the first FPCB 322 and the second FPCB 332 drawn from the module housing 310 may be disposed at least in part in the same direction and thus have overlapped portions (denoted by 'B'). Therefore, the first electrical connector 323 connected to the first FPC 322 and the second electrical connector 333 connected to the second FPCB 332 may be disposed side by side to be adjacent to each other in the same direction. This allows the two electrical connectors 323 and 333 to be more easily electrically connected to the PCB 121 disposed in the inner space of the electronic.

According to certain embodiments of the disclosure as described hereinbefore, at least two electronic components are disposed individually and independently in one module housing. Therefore, even if any one of the electronic components is damaged, the damaged component only can be replaced without replacing the other component. This can allow efficient maintenance of such electronic components. Further, the FPCBs connected to the respective electronic components are disposed to be overlapped at least in part with each other, so that it is possible to efficiently use a mounting space in the electronic device.

According to certain embodiments of the disclosure, an electronic device (e.g., the electronic device 100 in FIG. 1) may include a housing (e.g., the housing 110 in FIG. 1) including a printed circuit board (PCB) (e.g., the PCB 121 in FIG. 3) in an inner space (e.g., the inner space 1001 in FIG. 3) thereof, and a camera module assembly (e.g., the camera module assembly 300 in FIG. 4) disposed in the inner space. The camera module assembly may include a module housing (e.g., the module housing 310 in FIG. 4), a first camera module (e.g., the first camera module 320 in FIG. 4) having a first camera housing (e.g., the first camera unit 321 in FIG. 4), the first camera module disposed in at least a part of the module housing and including a first flexible PCB (FPCB) (e.g., the first FPCB 322 in FIG. 4) drawn out of the module housing and connected to the PCB, and a second camera module (e.g., the second camera module 330 in FIG. 4) having a second camera housing (e.g., the second camera unit 331 in FIG. 4) separate from the first camera housing, the second camera module disposed in the module housing to be adjacent to the first camera module and including a second FPCB (e.g., the second FPCB 332 in FIG. 4) drawn out of the module housing. The first and second FPCBs may be overlapped at least in part with each other, when the module housing is viewed from above, and drawn to face a same direction.

According to certain embodiments, the first FPCB may include a first electrical connector (e.g., the first electrical connector 323 in FIG. 4) electrically connected to the PCB, and the second FPCB may include a second electrical connector (e.g., the second electrical connector 333 in FIG. 4) electrically connected to the PCB. The first FPCB and the second FPCB may be disposed such that the first electrical connector and the second electrical connector are aligned side by side.

According to certain embodiments, the module housing may include a first opening (e.g., the first opening 3111 in FIG. 4) for accommodating the first camera module, and a second opening (e.g., the second opening 3112 in FIG. 4) for accommodating the second camera module. The first and second camera modules may be disposed to be exposed or protruded at least in part through the first and second openings, respectively.

According to certain embodiments, the module housing may include an extension (e.g., the extension 312 in FIG. 5B) having a support structure (e.g., the support structure 3121 in FIG. 5B) for supporting at least one electronic component disposed nearby.

According to certain embodiments, the at least one electronic component may include a radio frequency (RF) cable (e.g., the RF cable 130 in FIG. 5B) disposed in the inner space and electrically connecting the PCB to an antenna structure.

According to certain embodiments, the support structure may have a groove for accommodating and supporting at least a portion of the RF cable.

According to certain embodiments, the module housing may be formed of an injectable polymer.

According to certain embodiments, the first camera module or the second camera module may be disposed to be individually and electrically detachable from the module housing.

According to certain embodiments, the housing may include a front cover (e.g., the front cover 101 in FIG. 1), a rear cover (e.g., the rear cover 111 in FIG. 2) facing in a direction opposite to the front cover, and a lateral member (e.g., the lateral member 118 in FIG. 1) disposed to surround the inner space between the front cover and the rear cover. The camera module assembly may be disposed such that the first camera module and the second camera module detect an external environment through the rear cover.

According to certain embodiments, the electronic device may further include a display (e.g., the display 101 in FIG. 1) disposed in the inner space to be visible at least in part from an outside of the electronic device through the front cover.

According to certain embodiments of the disclosure, an electronic device (e.g., the electronic device 100 in FIG. 1) may include a housing (e.g., the housing 110 in FIG. 1) including a printed circuit board (PCB) (e.g., the PCB 121 in FIG. 3) in an inner space (e.g., the inner space 1001 in FIG. 3) thereof, and an electronic component assembly (e.g., the camera module assembly 300 in FIG. 4) disposed in the inner space. The electronic component assembly may include a module housing (e.g., the module housing 310 in FIG. 4), a first electronic component (e.g., the first camera module 320 in FIG. 4) having a first housing (e.g., the first camera unit 321 in FIG. 4), the first electronic component disposed in at least a part of the module housing and including a first flexible PCB (FPCB) (e.g., the first FPCB 322 in FIG. 4) drawn out of the module housing and connected to the PCB, and a second electronic component (e.g., the second camera module 330 in FIG. 4) having a second housing (e.g., the second camera unit 331 in FIG. 4) separate from the first housing, the second electronic component disposed in the module housing to be adjacent to the first electronic component and including a second FPCB (e.g., the second FPCB 332 in FIG. 4) drawn out of the module housing and connected to the PCB. The first and second FPCBs may be overlapped at least in part with each other, when the module housing is viewed from above, and drawn to face a same direction.

According to certain embodiments, the first FPCB may include a first electrical connector electrically connected to the PCB, and the second FPCB may include a second electrical connector electrically connected to the PCB. The first FPCB and the second FPCB may be disposed such that the first electrical connector and the second electrical connector are aligned side by side.

According to certain embodiments, the module housing may include an extension having a support structure for supporting at least one another electronic component disposed nearby.

According to certain embodiments, the at least one another electronic component may include a radio frequency (RF) cable disposed in the inner space and electrically connecting the PCB to an antenna structure.

According to certain embodiments, the support structure may have a groove for accommodating and supporting at least a portion of the RF cable.

According to certain embodiments, the first electronic component or the second electronic component may be disposed to be individually and electrically detachable from the module housing.

According to certain embodiments, at least one of the first electronic component or the second electronic component may include a proximity sensor module, a fingerprint sensor module, a gesture sensor module, a gyro sensor module, a barometric sensor module, a temperature sensor module, a humidity sensor module, a magnetic sensor module, an acceleration sensor module, a grip sensor module, an illumination sensor module, an infrared sensor module, a color sensor module, a camera module, an ultrasonic sensor module, an iris sensor module, a biometric sensor module, or a time-of-flight (TOF) sensor module.

According to certain embodiments, the housing may include a front cover, a rear cover facing in a direction opposite to the front cover, and a lateral member disposed to surround the inner space between the front cover and the rear cover. The electronic component assembly may be disposed such that the first electronic component and the second electronic component detect an external environment through the front cover and/or the rear cover.

According to certain embodiments, the electronic device may further include a display disposed in the inner space to be visible at least in part from an outside of the electronic device through the front cover.

According to certain embodiments, the module housing may be formed of metal and/or polymer.

While the disclosure has been particularly shown and described with reference to exemplary embodiments thereof, it will be understood by those skilled in the art that various changes in form and details may be made therein without departing from the scope of the subject matter as defined by the appended claims.

What is claimed is:

1. An electronic device comprising:
a housing including a printed circuit board (PCB) in an inner space thereof; and
a camera module assembly disposed in the inner space and including:
a module housing;
a first camera module having a first camera housing, the first camera module disposed in at least a part of the module housing and including a first flexible PCB (FPCB) drawn out of the module housing and connected to the PCB via a first electrical connector; and
a second camera module having a second camera housing separate from the first camera housing, the second camera module disposed in the module housing to be adjacent to the first camera module and including a second FPCB drawn out of the module housing and electrically connected to the PCB via a second electrical connector,
wherein the first and second FPCBs are overlapped at least in part with each other, when the module housing is viewed from above, and drawn to face a same direction, and
wherein the first FPCB and the second FPCB are disposed such that a first longitudinal axis of the first FPCB, a second longitudinal axis of the second FPCB, a third longitudinal axis of the first electrical connector, and a fourth longitudinal axis of the second electrical connector are parallel to each other.

2. The electronic device of claim 1, wherein the first FPCB and the second FPCB are disposed such that the first electrical connector and the second electrical connector are aligned side by side.

3. The electronic device of claim 1, wherein the module housing includes a first opening for accommodating the first camera module, and a second opening for accommodating the second camera module, and
wherein the first and second camera modules are disposed to be exposed or protruded at least in part through the first opening and the second opening, respectively.

4. The electronic device of claim 1, wherein the module housing includes an extension having a support structure for supporting at least one electronic component.

5. The electronic device of claim 4, wherein the at least one electronic component includes a radio frequency (RF) cable disposed in the inner space and electrically connecting the PCB to an antenna structure.

6. The electronic device of claim 5, wherein the support structure has a groove for accommodating and supporting at least a portion of the RF cable.

7. The electronic device of claim 1, wherein the module housing comprises a polymer.

8. The electronic device of claim 1, wherein the first camera module is configured to be removed from the module housing without removing the second camera module, and wherein the second camera module is configured to be removed from the module housing without removing the first camera module.

9. The electronic device of claim 1, wherein the housing includes a front cover, a rear cover facing in a direction opposite to the front cover, and a lateral member disposed to surround the inner space between the front cover and the rear cover, and
wherein the camera module assembly is disposed such that the first camera module and the second camera module detect an external environment through the rear cover.

10. The electronic device of claim 9, further comprising:
a display disposed in the inner space to be visible at least in part from an outside of the electronic device through the front cover.

11. An electronic device comprising:
a housing including a printed circuit board (PCB) in an inner space thereof; and
an electronic component assembly disposed in the inner space and including:
a module housing;
a first electronic component having a first housing, the first electrical component disposed in at least a part of the module housing and including a first flexible PCB (FPCB) drawn out of the module housing and connected to the PCB via a first electrical connector; and
a second electronic component having a second housing separate from the first housing, the second electronic component disposed in the module housing to be adjacent to the first electronic component and including a second FPCB drawn out of the module housing and connected to the PCB via a second electrical connector,
wherein the first and second FPCBs are overlapped at least in part with each other, when the module housing is viewed from above, and drawn to face a same direction, and
wherein the first FPCB and the second FPCB are disposed such that a first longitudinal axis of the first FPCB, a second longitudinal axis of the second FPCB, a third longitudinal axis of the first electrical connector, and a fourth longitudinal axis of the second electrical connector are parallel to each other.

12. The electronic device of claim 11, wherein the first FPCB and the second FPCB are disposed such that the first electrical connector and the second electrical connector are aligned side by side.

13. The electronic device of claim 11, wherein the module housing includes an extension having a support structure for supporting at least one another electronic component.

14. The electronic device of claim 13, wherein the at least one another electronic component includes a radio frequency (RF) cable disposed in the inner space and electrically connecting the PCB to an antenna structure.

15. The electronic device of claim 14, wherein the support structure has a groove for accommodating and supporting at least a portion of the RF cable.

16. The electronic device of claim 11, wherein the first electronic component is configured to be removed from the module housing without removing the second electronic component, and wherein the second electronic component is configured to be removed without removing the first electronic component.

17. The electronic device of claim 11, wherein at least one of the first electronic component or the second electronic component includes a proximity sensor module, a fingerprint sensor module, a gesture sensor module, a gyro sensor module, a barometric sensor module, a temperature sensor module, a humidity sensor module, a magnetic sensor module, an acceleration sensor module, a grip sensor module, an illumination sensor module, an infrared sensor module, a color sensor module, a camera module, an ultrasonic sensor module, an iris sensor module, a biometric sensor module, or a time-of-flight (TOF) sensor module.

18. The electronic device of claim 11, wherein the housing includes a front cover, a rear cover facing in a direction opposite to the front cover, and a lateral member disposed to surround the inner space between the front cover and the rear cover, and
wherein the electronic component assembly is disposed such that the first electronic component and the second electronic component detect an external environment through the front cover or the rear cover.

19. The electronic device of claim 18, further comprising:
a display disposed in the inner space to be visible at least in part from an outside of the electronic device through the front cover.

20. The electronic device of claim 11, wherein the module housing is formed of metal and/or polymer.

* * * * *